(12) United States Patent
Xie et al.

(10) Patent No.: US 9,461,171 B2
(45) Date of Patent: Oct. 4, 2016

(54) METHODS OF INCREASING SILICIDE TO EPI CONTACT AREAS AND THE RESULTING DEVICES

(71) Applicant: GLOBALFOUNDRIES Inc., Grand Cayman (KY)

(72) Inventors: Ruilong Xie, Niskayuna, NY (US); Hoon Kim, Clifton Park, NY (US); Naim Moumen, Clifton Park, NY (US); Chanro Park, Clifton Park, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 14 days.

(21) Appl. No.: 14/283,636

(22) Filed: May 21, 2014

(65) Prior Publication Data
US 2015/0340497 A1    Nov. 26, 2015

(51) Int. Cl.
| | |
|---|---|
| *H01L 21/336* | (2006.01) |
| *H01L 29/78* | (2006.01) |
| *H01L 29/66* | (2006.01) |
| *H01L 29/417* | (2006.01) |
| *H01L 29/08* | (2006.01) |
| *H01L 21/768* | (2006.01) |
| *H01L 21/285* | (2006.01) |
| *H01L 23/485* | (2006.01) |
| *H01L 29/165* | (2006.01) |

(52) U.S. Cl.
CPC ..... *H01L 29/7848* (2013.01); *H01L 21/28518* (2013.01); *H01L 21/28525* (2013.01); *H01L 21/76897* (2013.01); *H01L 23/485* (2013.01); *H01L 29/0847* (2013.01); *H01L 29/41783* (2013.01); *H01L 29/665* (2013.01); *H01L 29/66545* (2013.01); *H01L 29/66628* (2013.01); *H01L 29/66636* (2013.01); *H01L 21/76805* (2013.01); *H01L 29/165* (2013.01)

(58) Field of Classification Search
CPC .................... H01L 23/485; H01L 21/76847
USPC ............................................... 438/300
See application file for complete search history.

(56) References Cited

U.S. PATENT DOCUMENTS

2012/0043592 A1*  2/2012  Zhao ................ H01L 21/76847
                                                           257/288

* cited by examiner

*Primary Examiner* — Trung Q Dang
*Assistant Examiner* — Patricia Reddington
(74) *Attorney, Agent, or Firm* — Amerson Law Firm, PLLC

(57) ABSTRACT

One method disclosed includes, among other things, forming a gate structure above an active region of a semiconductor substrate, performing an epitaxial deposition process to form an epi semiconductor material on the active region in the source/drain region of the device, performing an etching process on the epi semiconductor material to remove a portion of the epi semiconductor material so as to define at least one epi recess in the epi semiconductor material, forming a metal silicide layer on the upper surface of the epi semiconductor material and in the at least one epi recess in the epi semiconductor material, and forming a conductive structure that is conductively coupled to the metal silicide layer.

22 Claims, 17 Drawing Sheets

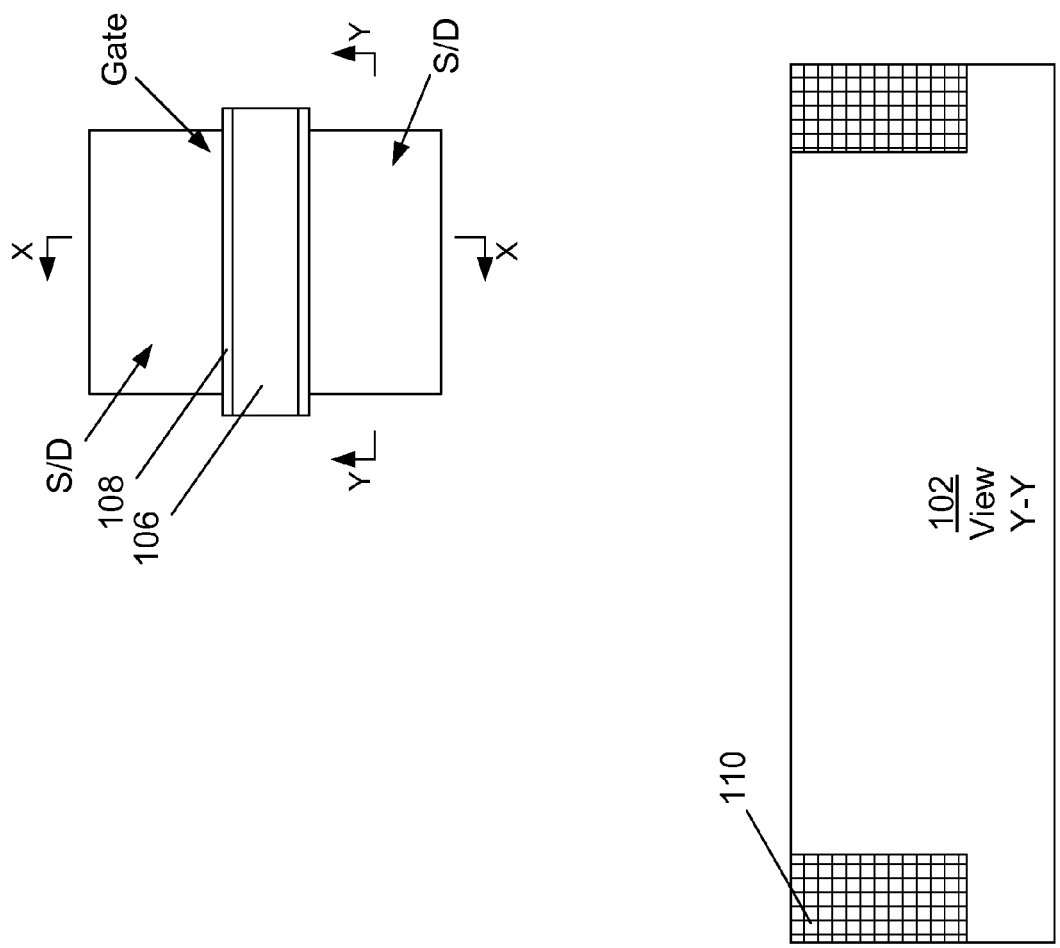
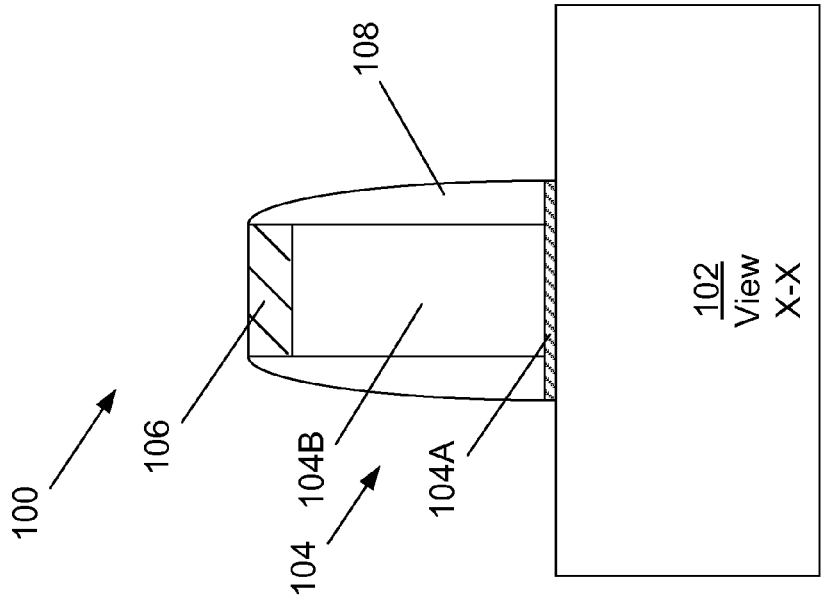
Figure 1A

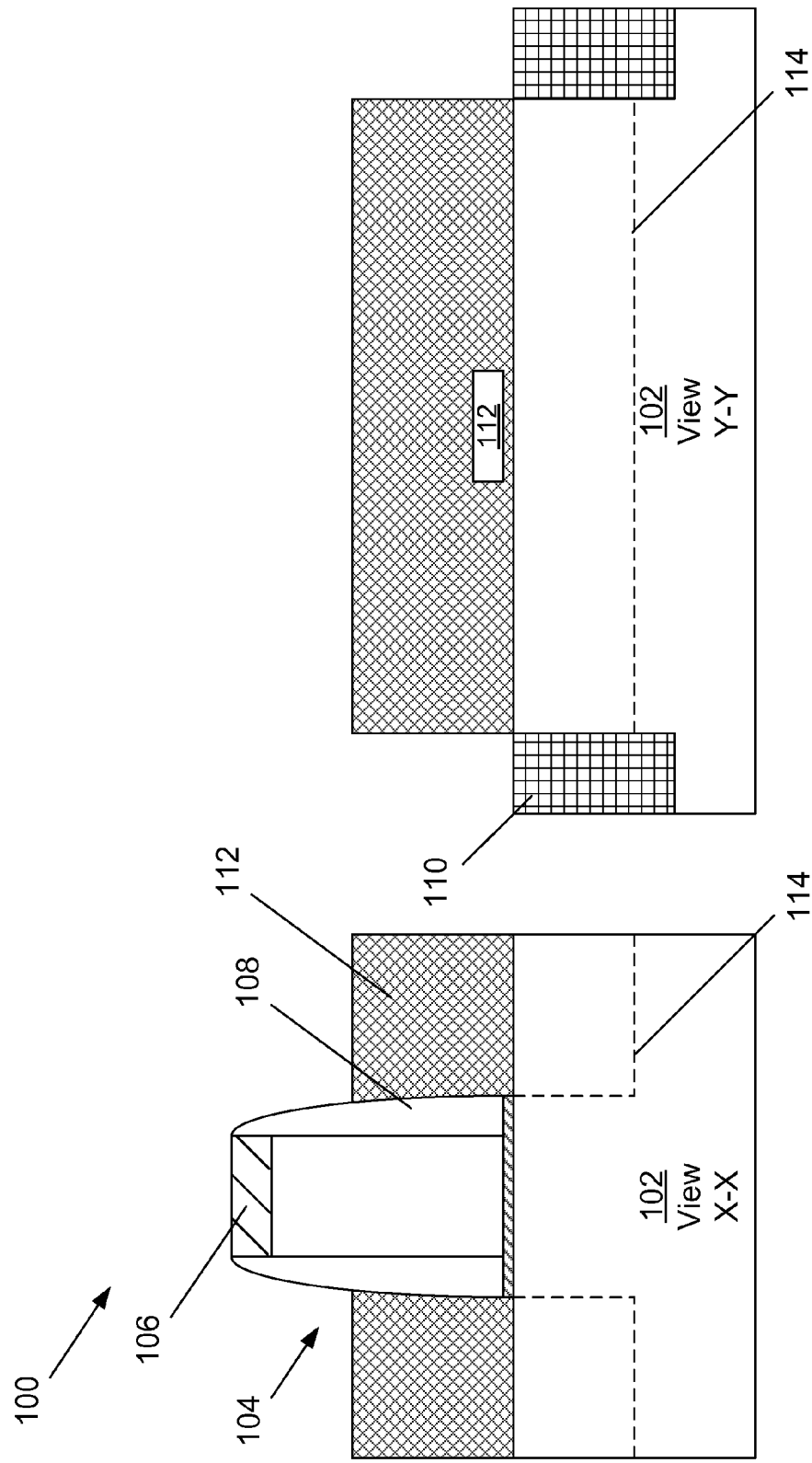

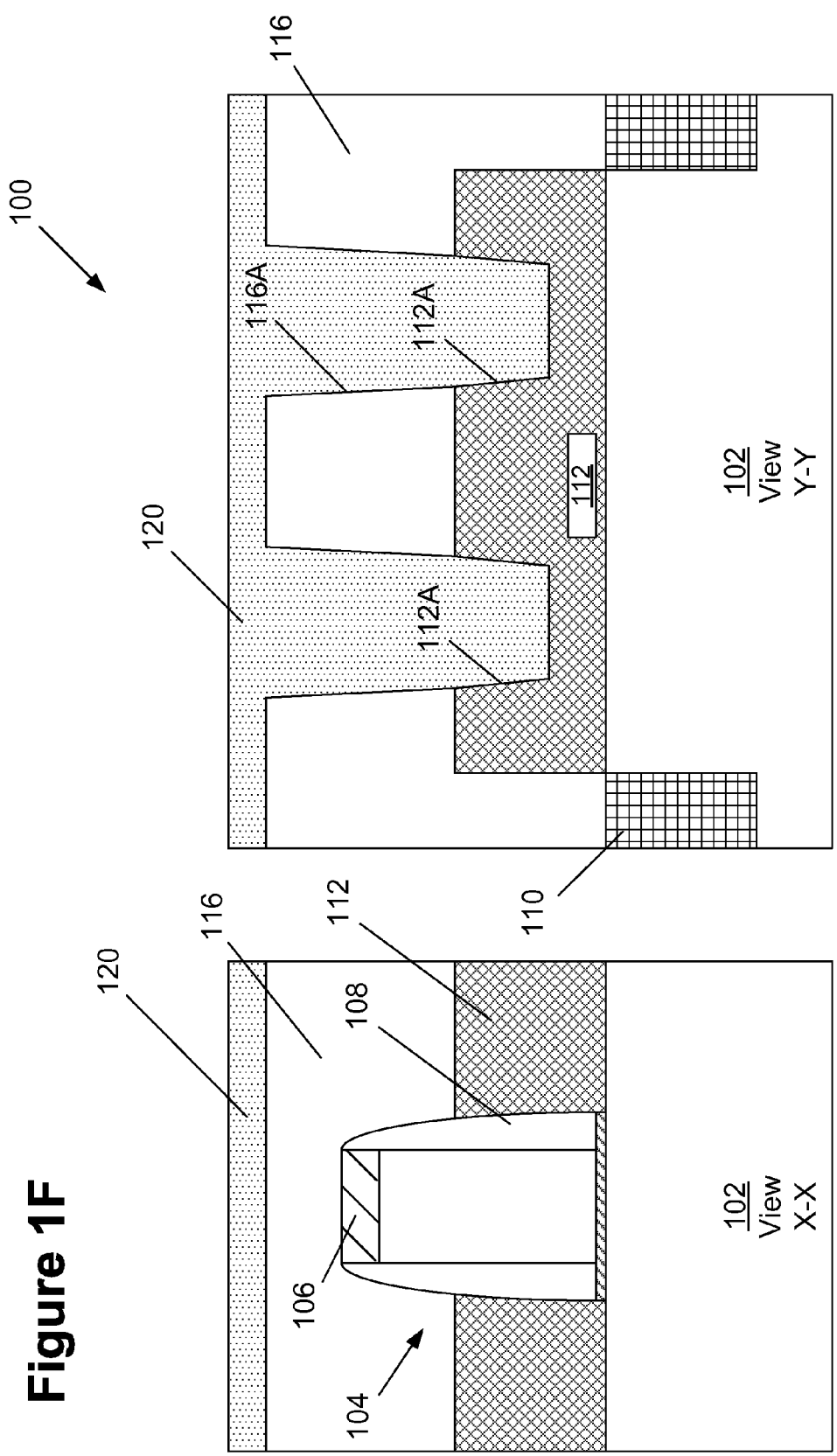

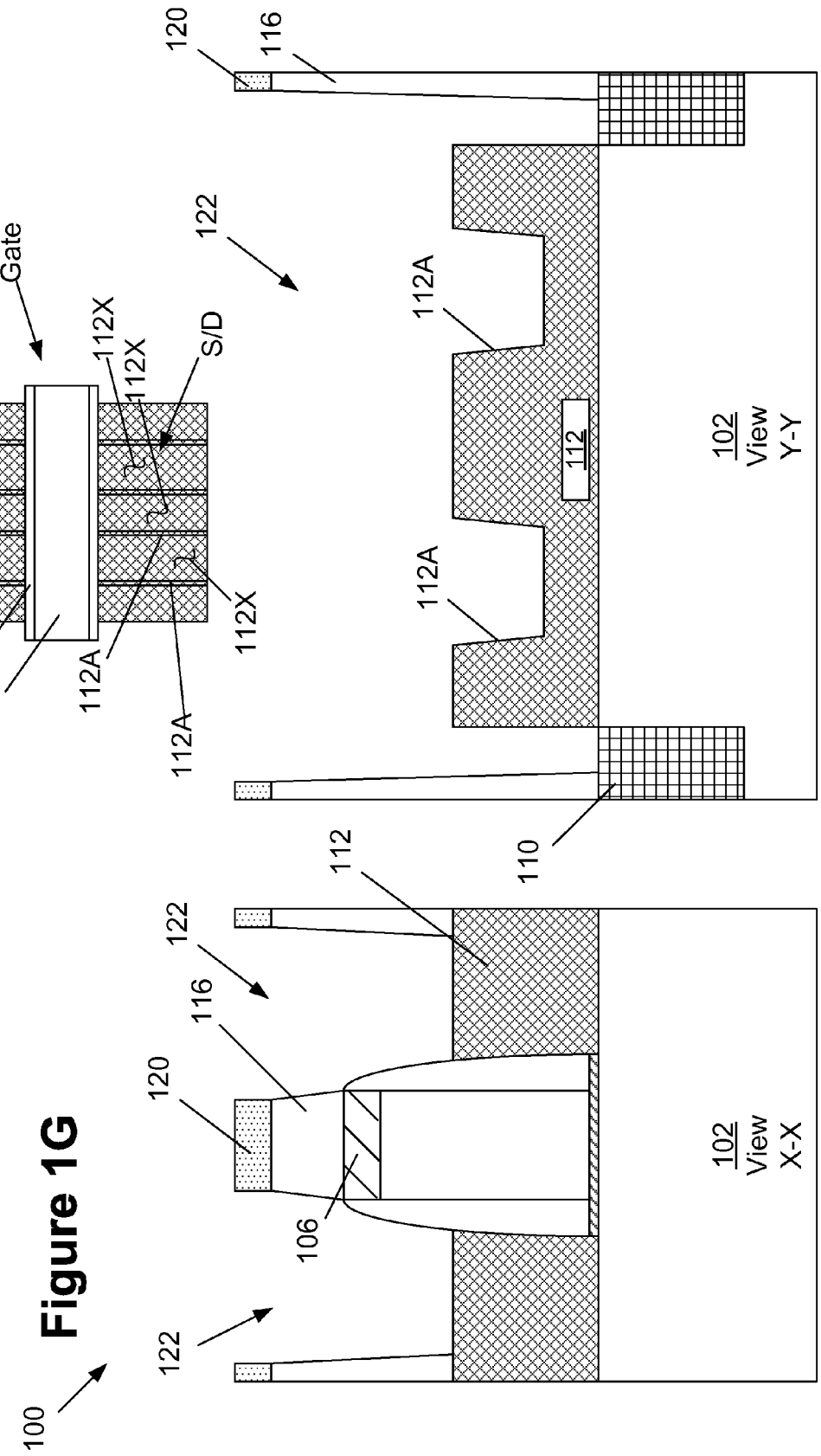

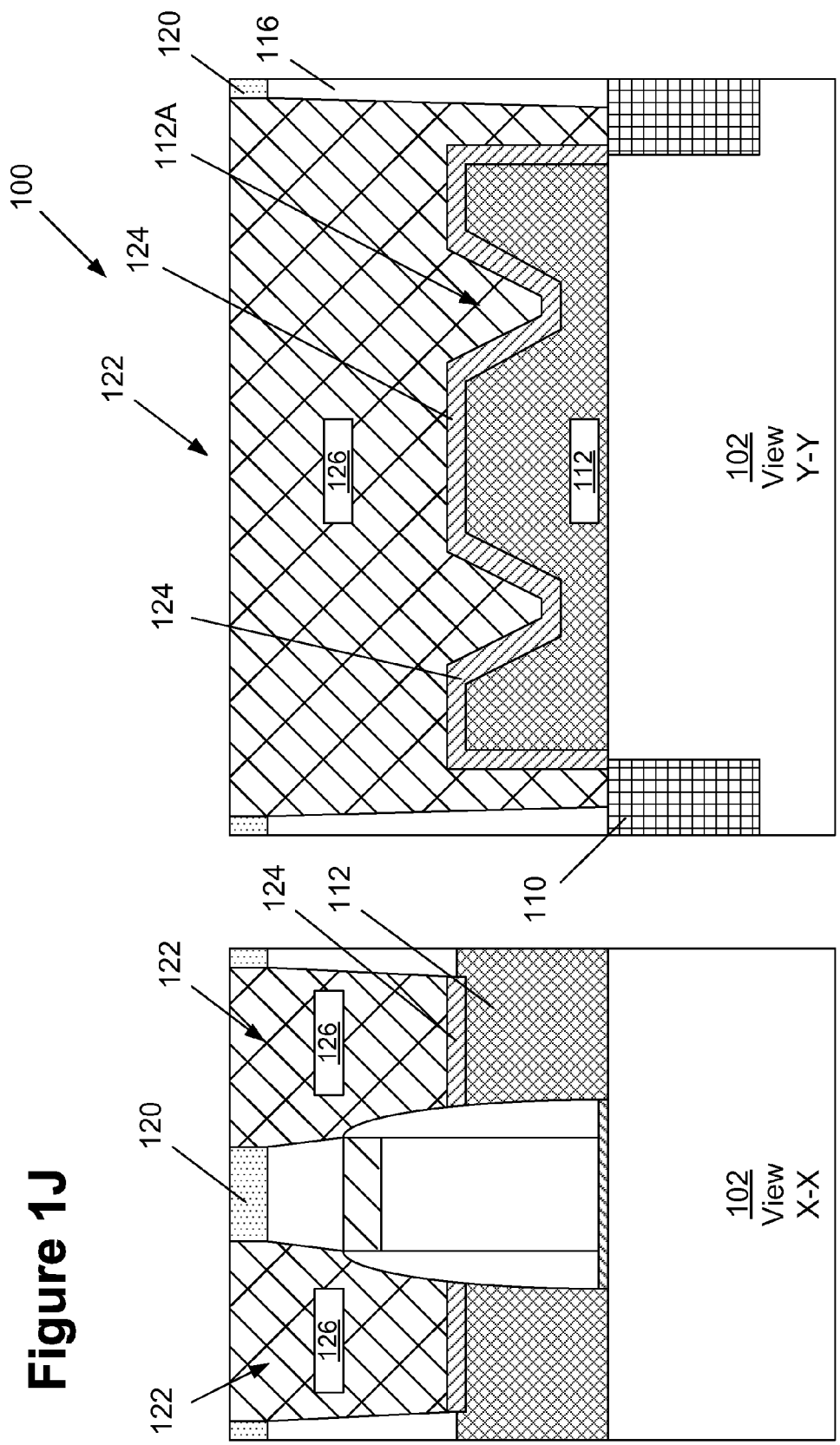

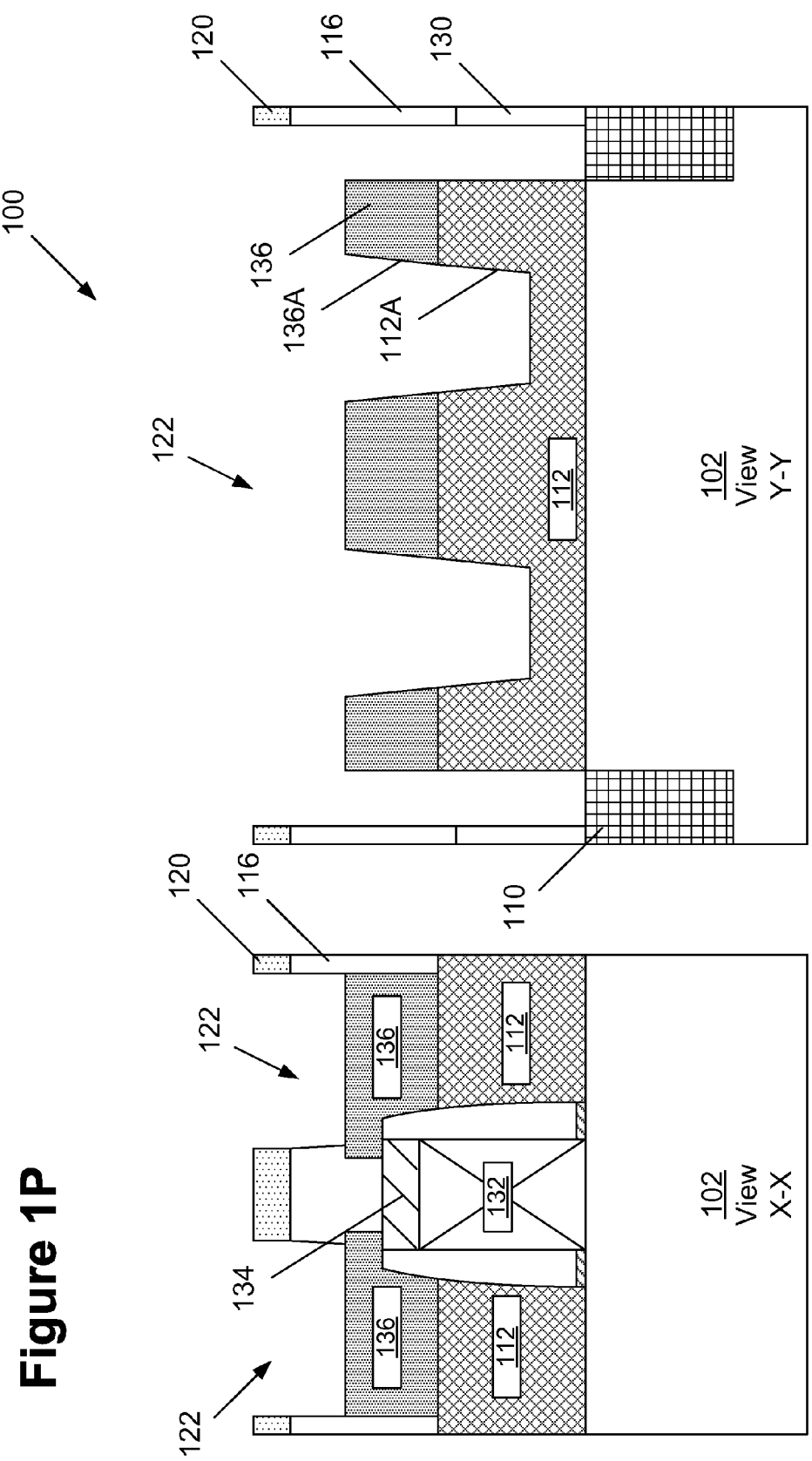

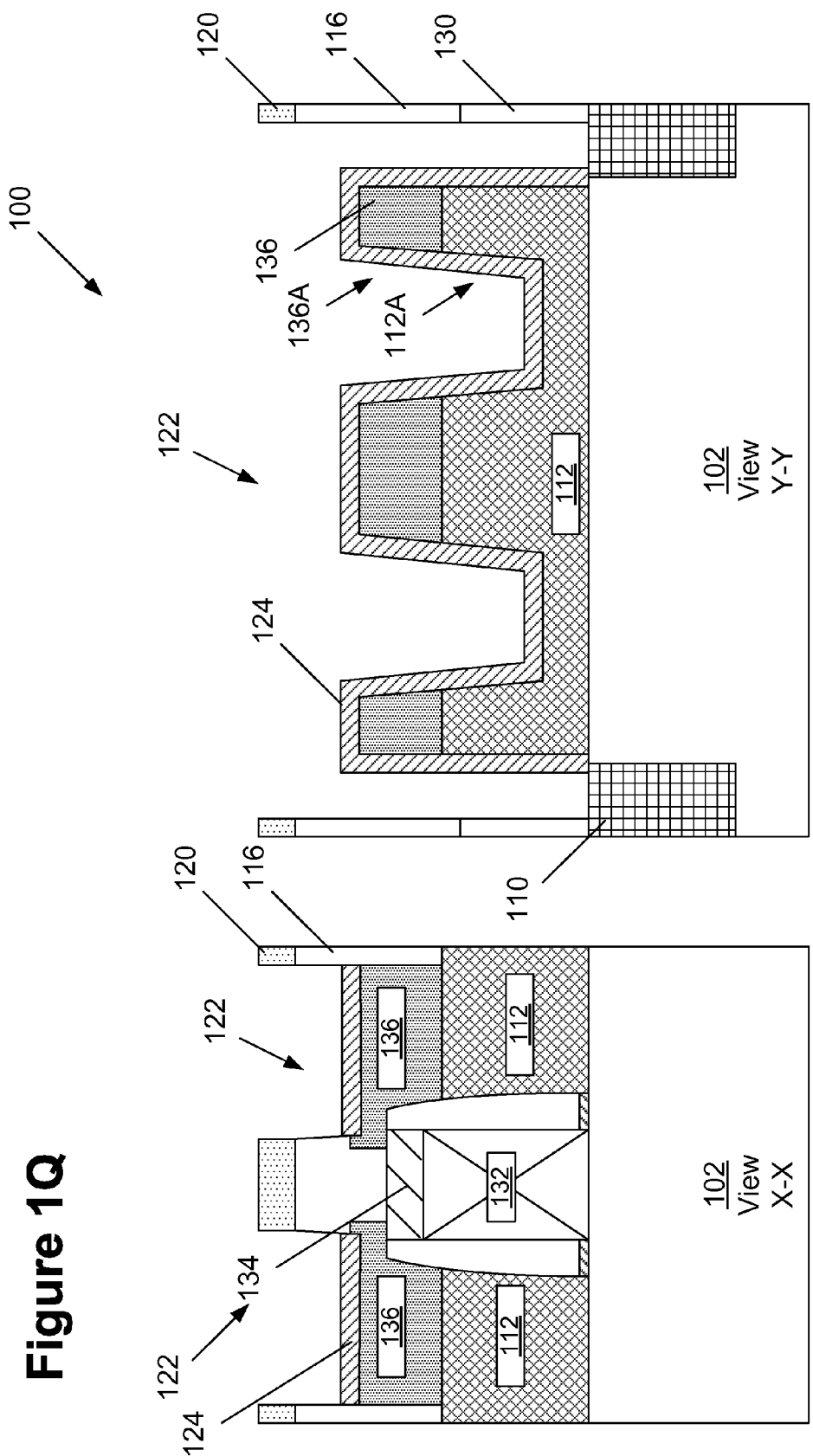

METHODS OF INCREASING SILICIDE TO EPI CONTACT AREAS AND THE RESULTING DEVICES

BACKGROUND OF THE INVENTION

1. Field of the Invention

The present disclosure generally relates to the fabrication of integrated circuits, and, more particularly, to various methods of increasing the contact area between a metal silicide material and an epi semiconductor material, and the resulting semiconductor devices.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. Such improvements in the performance of transistor devices has reached the point where the limiting factor of the finally achieved operating speed of complex integrated circuit products is no longer the individual transistor element but the electrical performance of the complex wiring system that is formed above the device level including the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, e.g., transistors with gate lengths of 50 nm and less, the contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

Another problem with continued scaling of transistor devices is that the electrical resistance between the conductive contacts and the transistor element is becoming a larger portion of the overall electrical resistance. Traditionally, metal silicide layers are formed in the source/drain regions of a device and on the gate electrode of a device in order to reduce electrical contact resistance. Ideally, one could simply increase the contact area between the metal silicide layer and the underlying silicon or epi semiconductor material. In the case of FinFET devices, this could theoretically be accomplished by forming the epi material on the fins in an un-merged condition, i.e., no contact between epi material on adjacent fins, and thereafter form an individual metal silicide layer that wraps around each of the separated epi materials. In practice, this is a very difficult task for several reasons. First, when epi semiconductor material is grown on a fin, it is very difficult to control the thickness of the epi semiconductor material, thus the epi material may unintentionally be merged together, thereby preventing the formation of the wrap-around metal silicide layers. One possible solution to avoid such unintended fin merger would be to form the epi material on the fin to a very small thickness to virtually assure that unintended fin merger does not occur. The drawbacks to this approach are that such a very small volume of epi material will tend to increase the overall resistance and such a thin layer of epi material may be substantially consumed by the metal silicide material and/or damaged during the contact formation process.

The present disclosure is directed to various methods of increasing the contact area between a metal silicide material and an epi semiconductor material, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of increasing the contact area between a metal silicide material and an epi semiconductor material, and the resulting semiconductor devices. One method disclosed includes, among other things, forming a gate structure above an active region of a semiconductor substrate, performing an epitaxial deposition process to form an epi semiconductor material on the active region in the source/drain region of the device, performing an etching process on the epi semiconductor material to remove a portion of the epi semiconductor material so as to define at least one epi recess in the epi semiconductor material, forming a metal silicide layer on the upper surface of the epi semiconductor material and in the at least one epi recess in the epi semiconductor material, and forming a conductive structure that is conductively coupled to the metal silicide layer.

A further illustrative method disclosed herein includes, among other things, forming a gate structure above an active region of a semiconductor substrate, performing a first epitaxial deposition process to form a first epi semiconductor material on the active region in the source/drain region of the device, performing a second epitaxial deposition process to form a second epi semiconductor material on the upper surface of the first epi semiconductor material, performing at least one etching process on the first and second epi semiconductor materials to remove a portion of the first and second epi semiconductor material so as to define at least one epi recess that extends through the second epi material and into the first epi semiconductor material, forming a metal silicide layer on the upper surface of the second epi semiconductor material and in the at least one epi recess, wherein the metal silicide layer contacts both of the first and second epi semiconductor materials, and forming a conductive structure that is conductively coupled to the metal silicide layer.

One illustrative example of a novel transistor device disclosed herein includes, among other things, a gate structure positioned above an active region of a semiconductor substrate, an epi semiconductor material positioned on the active region in the source/drain region of the device, at least one epi trench formed in the epi semiconductor material, a metal silicide layer positioned on the upper surface of the epi semiconductor material and in the at least one trench in the epi semiconductor material, and a conductive structure that is conductively coupled to the metal silicide layer.

BRIEF DESCRIPTION OF THE DRAWINGS

The disclosure may be understood by reference to the following description taken in conjunction with the accompanying drawings, in which like reference numerals identify like elements, and in which.

Figure 1C:
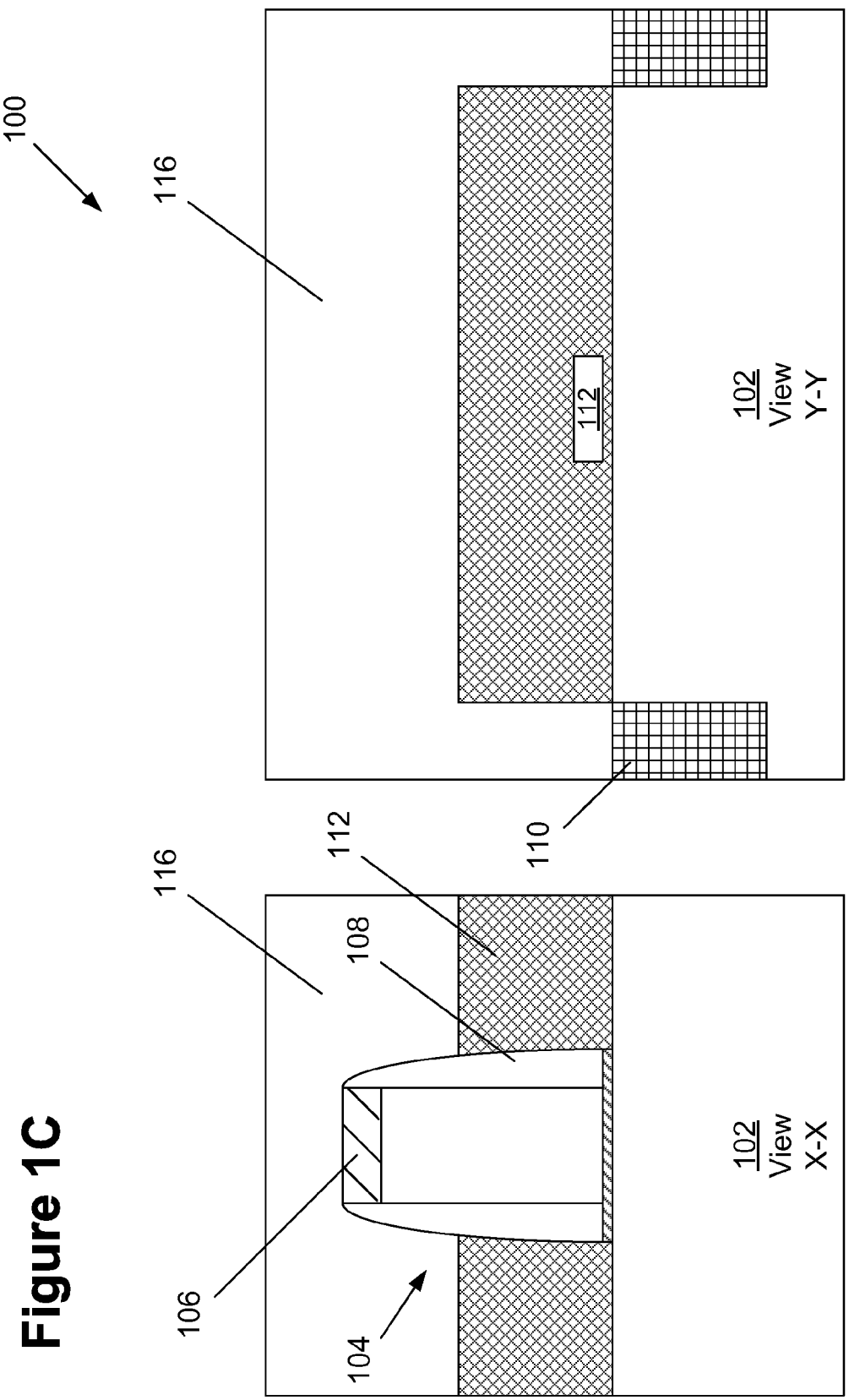
FIGS. 1A-1Q depict various illustrative methods and devices disclosed herein for increasing the contact area between a metal silicide material and an epi semiconductor material, and the resulting semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of increasing the contact area between a metal silicide material and an epi semiconductor material, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be further appreciated by those skilled in the art after a complete reading of the present application, the inventions disclosed herein may be employed in forming integrated circuit products using planar transistor devices or a variety of so-called 3D devices, such as FinFETs. For purposes of disclosure, reference will be made to an illustrative process flow wherein a single planar transistor device 100 is formed. Moreover, the inventions disclosed herein may be employed where the gate structures of the device 100 are formed using either "gate-first" or replacement gate ("gate-last") processing techniques. Of course, the inventions disclosed herein should not be considered to be limited to the illustrative examples depicted and described herein. With reference to the attached figures, various illustrative embodiments of the methods and devices disclosed herein will now be described in more detail.

The attached drawings present various views of one illustrative embodiment of a planar transistor device 100 that may be formed using the methods disclosed herein. FIG. 1A contains a simplistic plan view of the device 100 (in the upper right corner) that depicts the location where various cross-sectional views depicted in the following drawings will be taken. More specifically, the view "X-X" is a cross-sectional view that is taken through the gate structure of the device in the gate-length direction, and the view "Y-Y" is a cross-sectional view that is taken through the source/drain (S/D) regions of the device in the gate-width direction of the device). The various layers of material depicted in the following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIG. 1A schematically illustrates a cross-sectional view of the device 100 at an advanced stage of manufacturing. As illustrated, the device 100 comprises an illustrative gate structure 104 that is formed above a substrate 102. Also depicted in FIG. 1A are an illustrative gate cap layer 106, sidewall spacers 108 and an isolation region 110 formed in the substrate 102. The substrate 102 may have a variety of configurations, such as the depicted bulk substrate configuration. The substrate 102 may have an SOI (silicon-on-insulator) configuration wherein the semiconductor devices are formed in the active layer of the SOI substrate. The substrate 102 may be made of silicon or it may be made of materials other than silicon. Thus, the terms "substrate,"

"semiconductor substrate" or "semiconducting substrate" should be understood to cover all semiconducting materials and all forms of such materials.

With continuing reference to FIG. 1A, the gate structure 104 is intended to be representative in nature of any type of gate structure that may be employed in manufacturing integrated circuit products using so-called gate-first or gate-last (replacement gate) manufacturing techniques. In general, the gate structure 104 is comprised of one or more gate insulation layers 104A, such as, for example, silicon dioxide, a so-called high-k (k greater than 10) insulation material (where k is the relative dielectric constant), etc., and one or more conductive material layers that act as the gate electrode 104B, e.g., titanium nitride, tantalum nitride, tungsten, aluminum, polysilicon, etc. In the case where a replacement gate process is employed, the gate structure 104 may be a so-called "dummy" or sacrificial gate structure. The illustrative gate cap layer 106 (e.g., a silicon nitride cap layer) and the sidewall spacers 108 (e.g., silicon nitride spacers) encapsulate and protect the gate structure 104. The spacers 108 were formed by depositing a layer of spacer material adjacent the gate structure 104 and thereafter performing an anisotropic etching process on the layer of spacer material. The gate cap layer 106 may be formed using a variety of known techniques depending upon whether a gate-first or gate-last manufacturing technique is used.

FIG. 1B depicts the product 100 after an epitaxial deposition process was performed to form an epi semiconductor material 112, e.g., silicon, silicon-germanium, silicon-carbon, etc., in the source/drain regions of the device 100. In some applications, cavities (depicted by dashed lines 114 in FIG. 1B) may be formed in the substrate 102 prior to the formation of the epi semiconductor material 112. The epi semiconductor material 112 may be formed to any desired thickness, it may be doped or undoped and it may be formed in an unstressed condition or with a desired stress condition (tensile or compressive) in an effort to impart a desired stress on the channel region of the device 100.

FIG. 1C depicts the device 100 after a layer of insulating material 116 was deposited across the device 100. The layer of insulating material 116 may be comprised of a variety of different materials, such as silicon dioxide, a low-k (k value less than 3.3) material, etc., and it may be formed by performing a variety of techniques, e.g., CVD, etc. The thickness of the layer of insulating material 116 may vary depending upon the particular application.

Figure 1D:
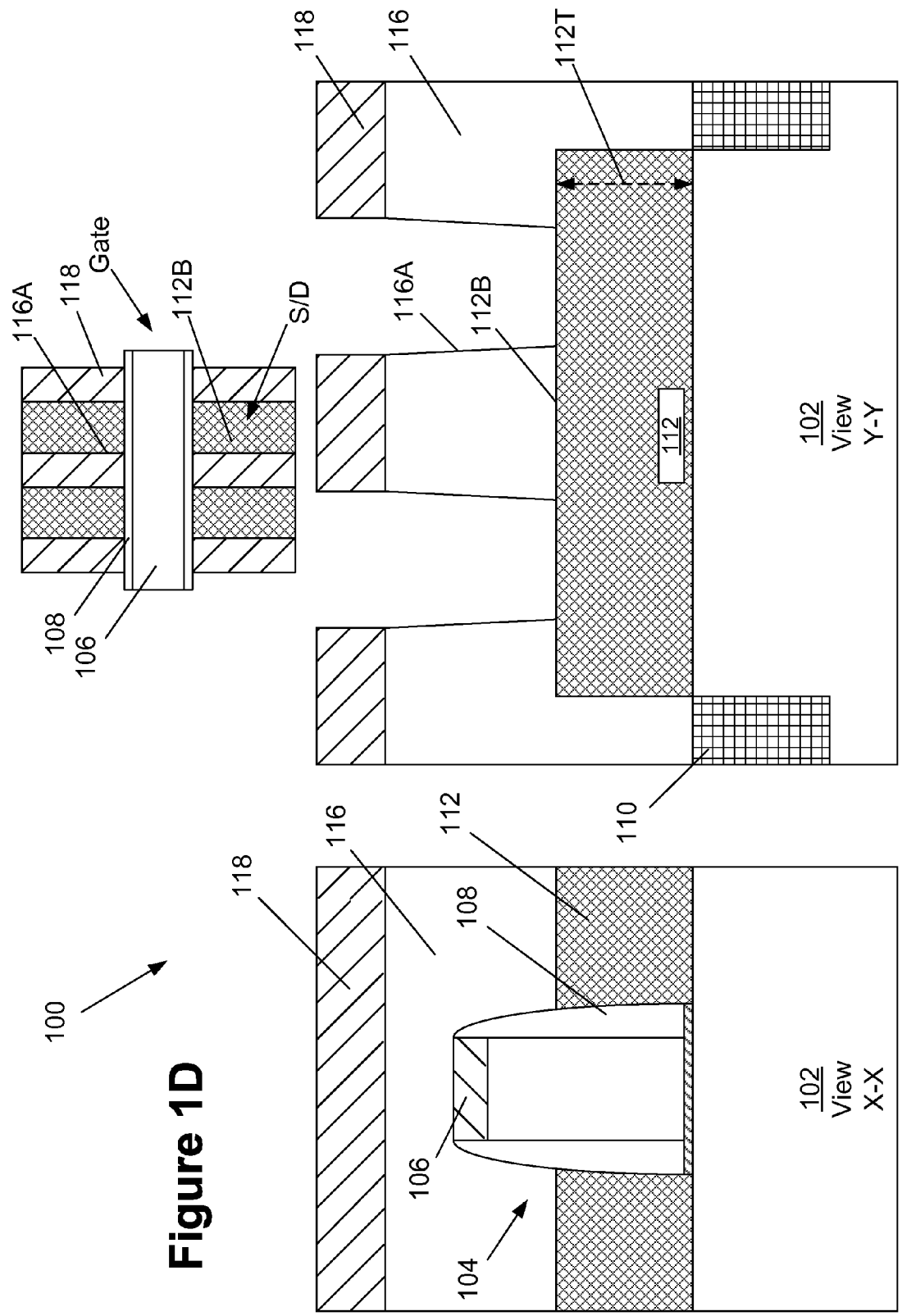

FIG. 1D depicts the device 100 after several process operations were performed. First, a patterned etch mask 118, such as a patterned layer of photoresist material, was formed above the layer of insulating material 116. Thereafter, a first etching process was performed to define openings 116A in the layer of insulating material 116.

Figure 1E:
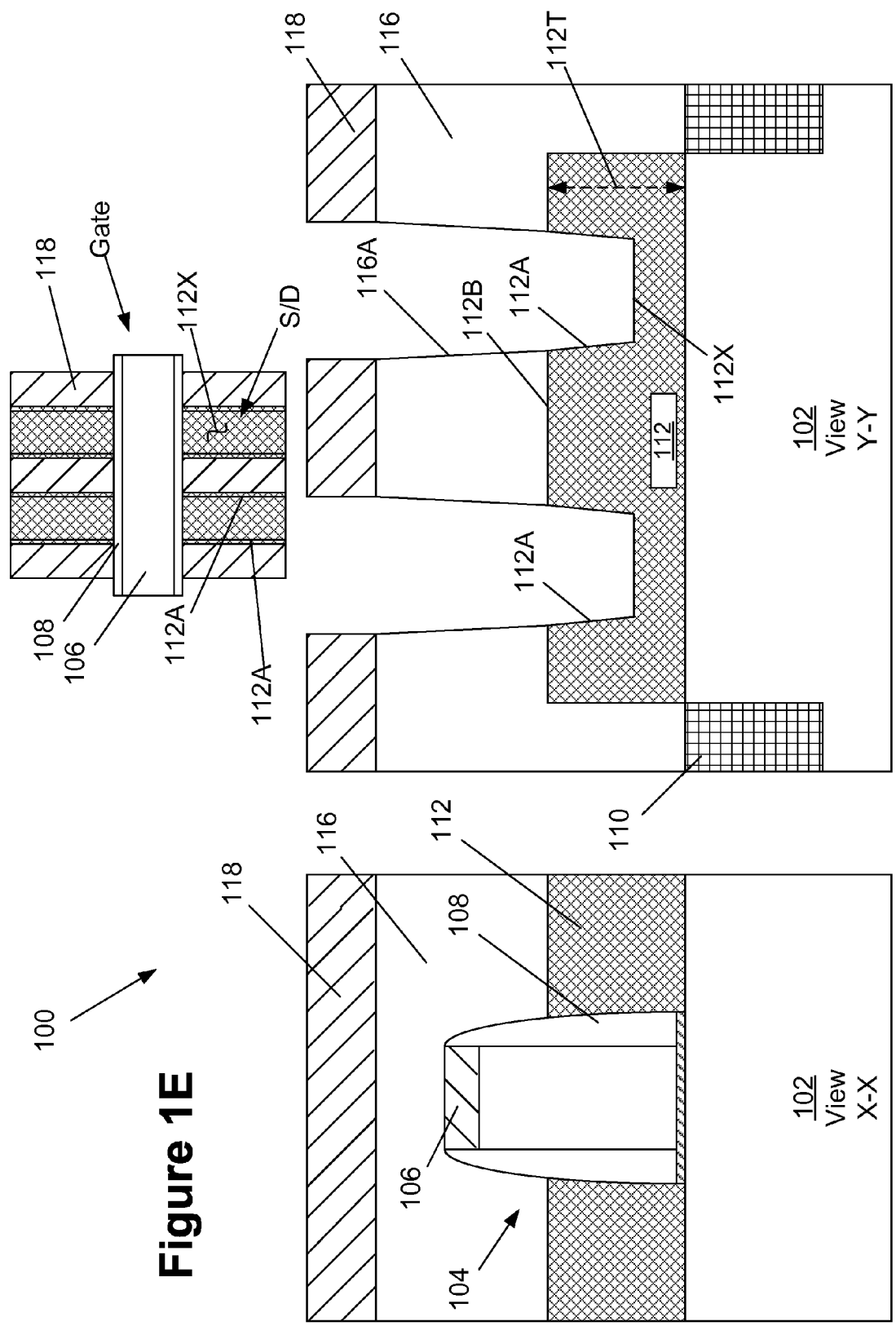

FIG. 1E depicts the device after a second etching process was performed on the epi semiconductor material 112 through at least the openings 116A (the mask 118 may have been removed at this point if desired) to remove portions of the epi semiconductor material 112 and thereby define epi recesses or trenches 112A in the epi semiconductor material 112. The epi recesses 112A have a bottom surface 1112X. A portion of the upper surface 112B of the epi semiconductor material 112 is positioned between the epi recesses 112A. Of course, the number of such epi recesses 112A that may be formed can vary depending upon the application. The depth and configuration of the epi recesses 112A may vary depending upon the particular application, and the etching techniques used to form the epi recesses 112A. In one illustrative example, where the epi semiconductor material has an overall thickness 112T of about 50 nm, the depth of the epi recesses 112A may be about 30 nm. The width of the epi recesses 112A (at the top of the recess 112A in the gate width direction of the device) may vary as well depending upon the particular application. FIG. 1E also contains a simplistic plan view of the device wherein the patterned etch mask 118 and the layer of insulating material 116 have been removed. As can be seen in this plan view drawing, in one particular application, the epi recesses 112A are trenches that extend across substantially the entire source/drain regions, wherein the trenches have a long axis that extend in a direction substantially parallel to the gate length or current transport direction of the device 100, and thereby abut the sidewall spacers 108.

FIG. 1F depicts the device 100 after another layer of insulating material 120 was deposited across the device 100 so as to fill the openings 116A and the epi trenches 112A. In one illustrative embodiment, the layer of insulating material 120 may be comprised of the same material as that of the layer of insulating material 116, or it may be made of a different material. Different shading is used for the layer of insulating material 120 so as to indicate the separate formation of the layer of material 120. Additional planarization processes may be performed on the layers 116/120 if needed.

FIG. 1G depicts the device 100 after or more etching processes were performed through a patterned etch mask (not shown) to remove portions of the layer of insulating material 120 and the layer of insulating material 116 to thereby define a plurality of contact openings 122. The etching process(es) exposes the epi semiconductor material 112 having the epi recesses 112A formed therein.

Figure 1H:
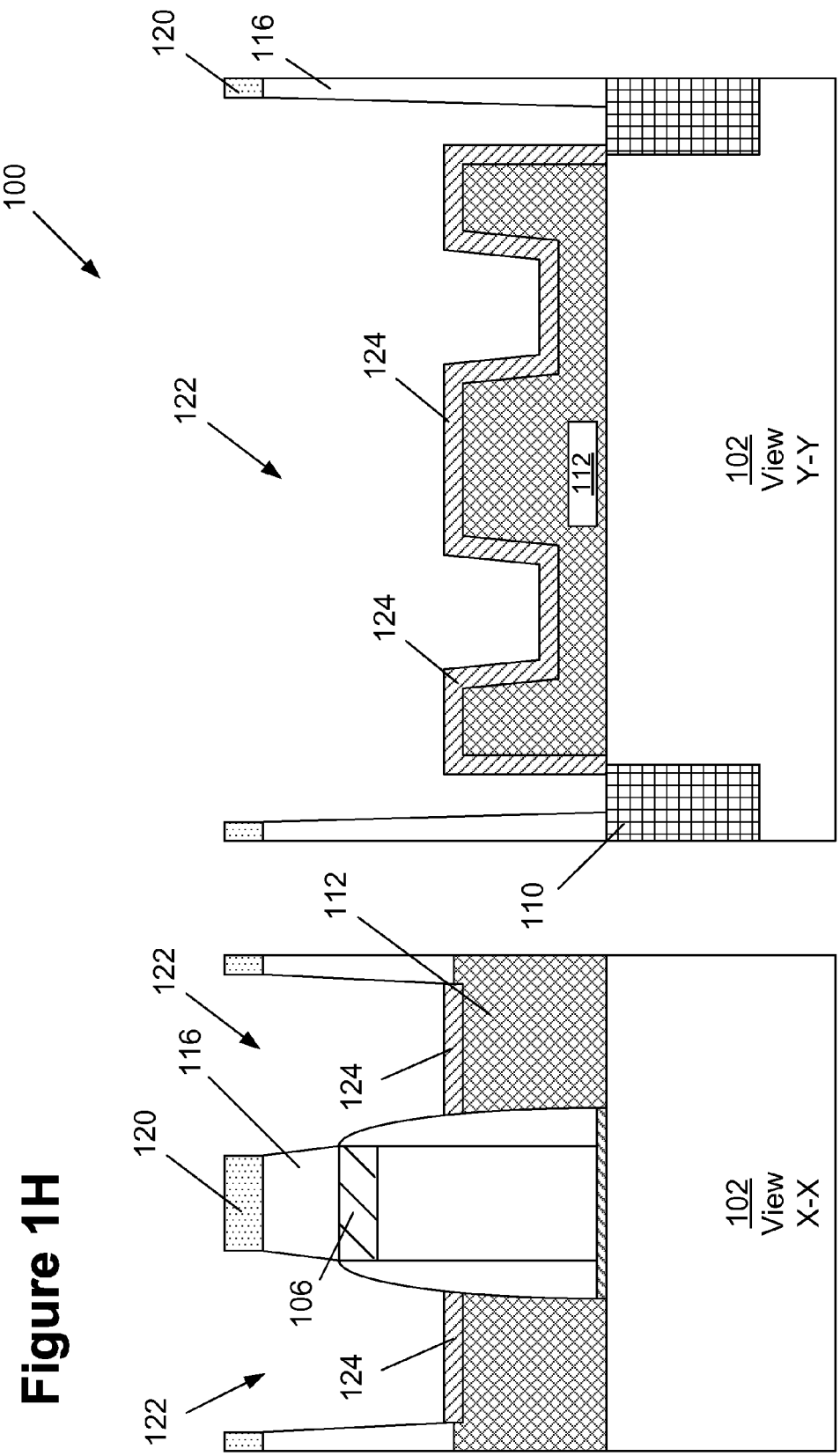

FIG. 1H depicts the device 100 after a metal silicide layer 124 was formed on the exposed portions of the epi semiconductor material 112 and in the epi recesses 112A. By virtue of the formation of the epi recesses 112A, the contact area between the epi semiconductor material 112 and the metal silicide layer 124 is significantly increased relative to the situation where the metal silicide layer 124 would be formed on a substantially planar upper surface of the epi semiconductor material 112 formed in the source/drain regions of the device 100. The metal silicide layer 124 is formed in the source/drain regions of the transistor device 100 to reduce the contact resistance when a conductive contact is formed to establish electrical connection to the source/drain regions. The metal silicide layer 124 depicted herein may be formed using a variety of different refractory metals, e.g., nickel, platinum, cobalt, etc., or combinations thereof, and it may be formed using techniques that are well known to those skilled in the art. The typical steps performed to form metal silicide regions are: (1) depositing a layer of refractory metal; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art. In the illustrative example depicted herein, the metal silicide layer 124 may be formed by initially performing a highly-conformal atomic layer deposition (ALD) process or an RF physical vapor deposition (PVD) process to deposit a layer of, for example, nickel, having a thickness of, for example, 1-5 nm. Thereafter, the anneal-etch-anneal process sequence described above is performed to complete the formation of the metal silicide layer 124. In one illustrative embodiment, the metal silicide layer 124 may have a thickness of about 2-10 nm. In other cases, a silicide liner process may be performed to form metal silicide layer 124. For example, such a silicide liner process may involve deposition of a nickel or nickel-platinum liner, followed by the deposition of a titanium nitride liner, followed by performing an anneal process or directly depositing tungsten on top of the titanium nitride liner without performing any anneal process. Using the silicide liner technique, no metal removal process is involved. The thickness of such liners may vary, e.g., 2-8 nm.

Figure 1I:
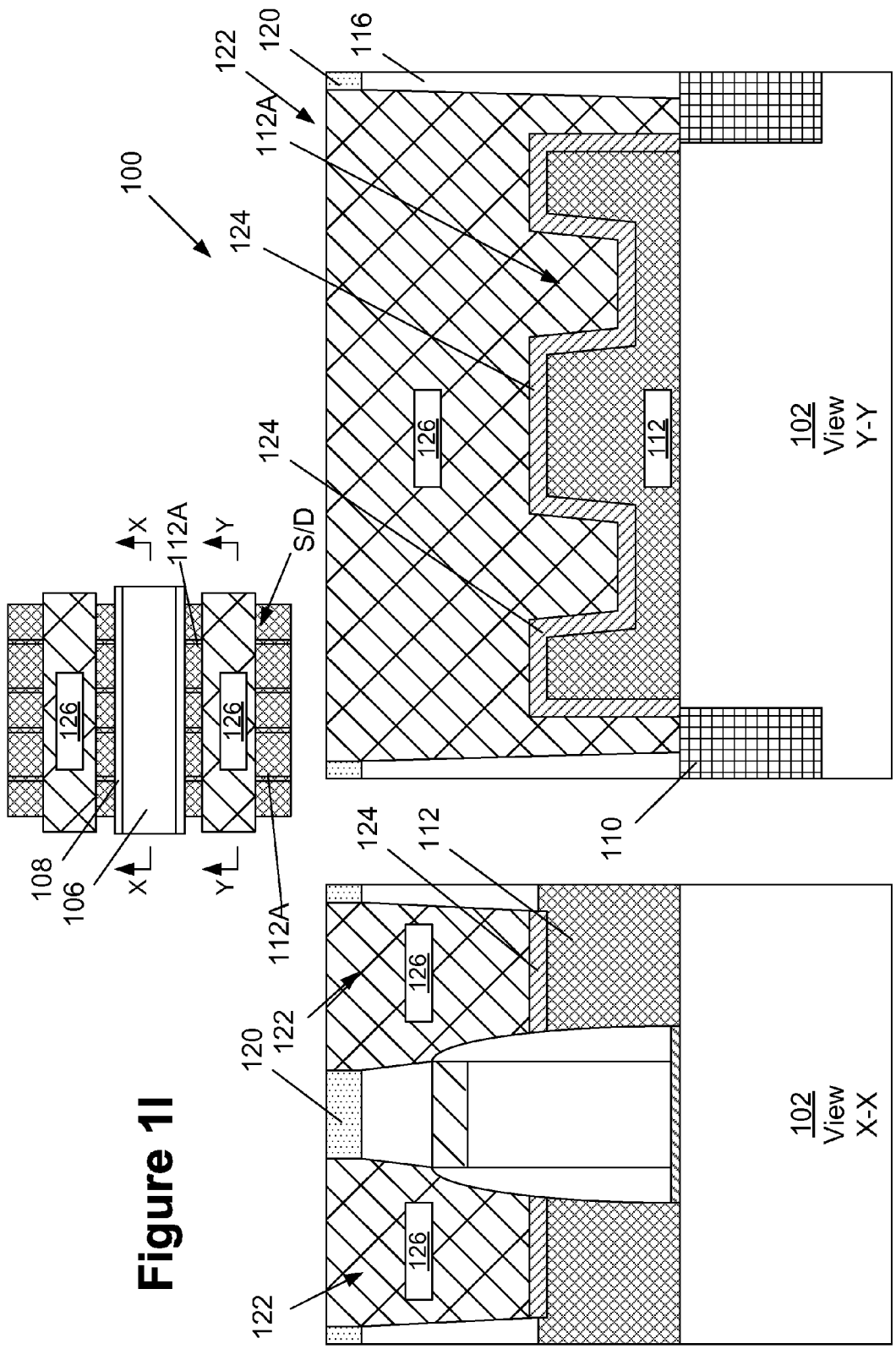

FIG. 1I depicts the device 100 after illustrative conductive contact structures 126 have been formed in the contact openings 122 such that they are conductively coupled to the source/drain regions of the device 100 via the metal silicide layer 124. The contact structures 126 are intended to be schematic and representative in nature, as they may be formed using any of a variety of different conductive materials and by performing traditional manufacturing operations. In one illustrative embodiment, the contact structures 126 may be self-aligned contact structures. The contact structures 126 may also contain one or more barrier layers (not depicted). In one illustrative example, the contact structures 126 may be formed by depositing a liner, e.g., a titanium nitride liner, followed by overfilling the contact openings 122 with a conductive material, such as tungsten. Thereafter, a CMP process may be performed to planarize the upper surface of the layer of insulating material 120/116 which results in the removal of excess portions of the liner and the tungsten positioned above the layer of insulating material 120/116 outside of the contact openings 122 and the formation of the depicted contact structures 126. FIG. 1I also contains a simplistic plan view of the device wherein the layers of insulating material 120/116 have been removed. As can be seen in this plan view drawing, in one particular application, the conductive structures 126 are line-type structures that extend across the source/drain regions of the device 100 in the gate width direction of the device 100, wherein the structures 126 have a long axis that is oriented in a direction that is substantially parallel to the gate width direction of the transistor device 100. Note that, in the depicted examples, the entire bottom surface of the conductive structure 126 contacts an entire upper surface of the metal silicide layer 124.

In FIG. 1I, the epi recesses 112A have a substantially rectangular cross-sectional configuration, as shown in the Y-Y view. Other cross-sectional configurations of the epi recesses 112A are also possible. For example, FIG. 1J depicts an embodiment where the epi recesses 112A in the epi semiconductor material 112 are formed so as to have a substantially V-shaped cross-sectional configuration, as shown in the Y-Y view. The etching process that is performed to form the epi recesses 112A may be controlled so as to form the substantially V-shaped recesses 112A depicted in FIG. 1J.

Figure 1K:
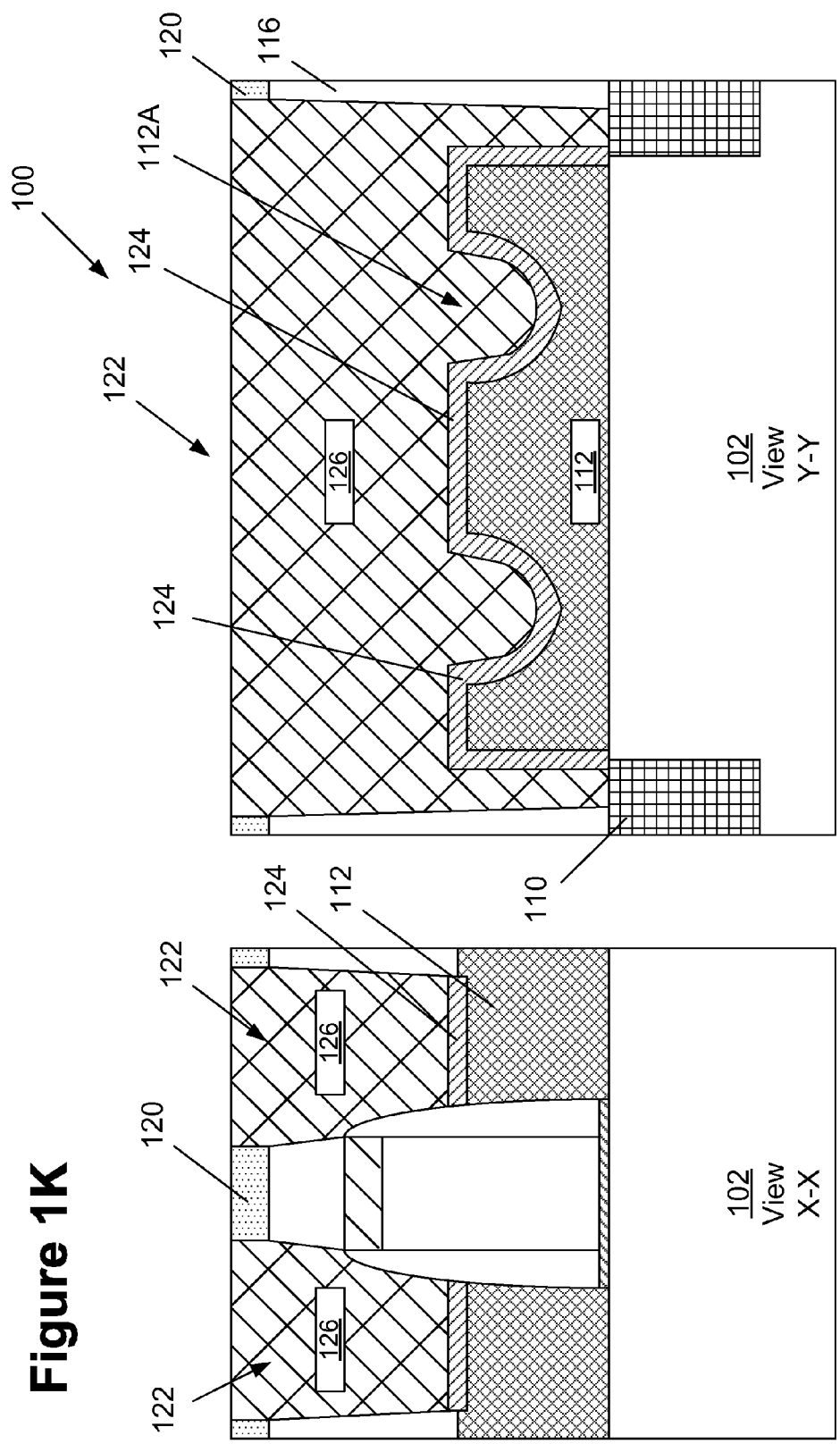

FIG. 1K depicts another embodiment where the epi recesses 112A in the epi semiconductor material 112 are formed so has to have a substantially U-shaped cross-sectional configuration, as shown in the Y-Y view. The etching process that is performed to form the epi recesses 112A may be controlled so as to form the substantially U-shaped recesses 112A depicted in FIG. 1K.

Figure 1L:
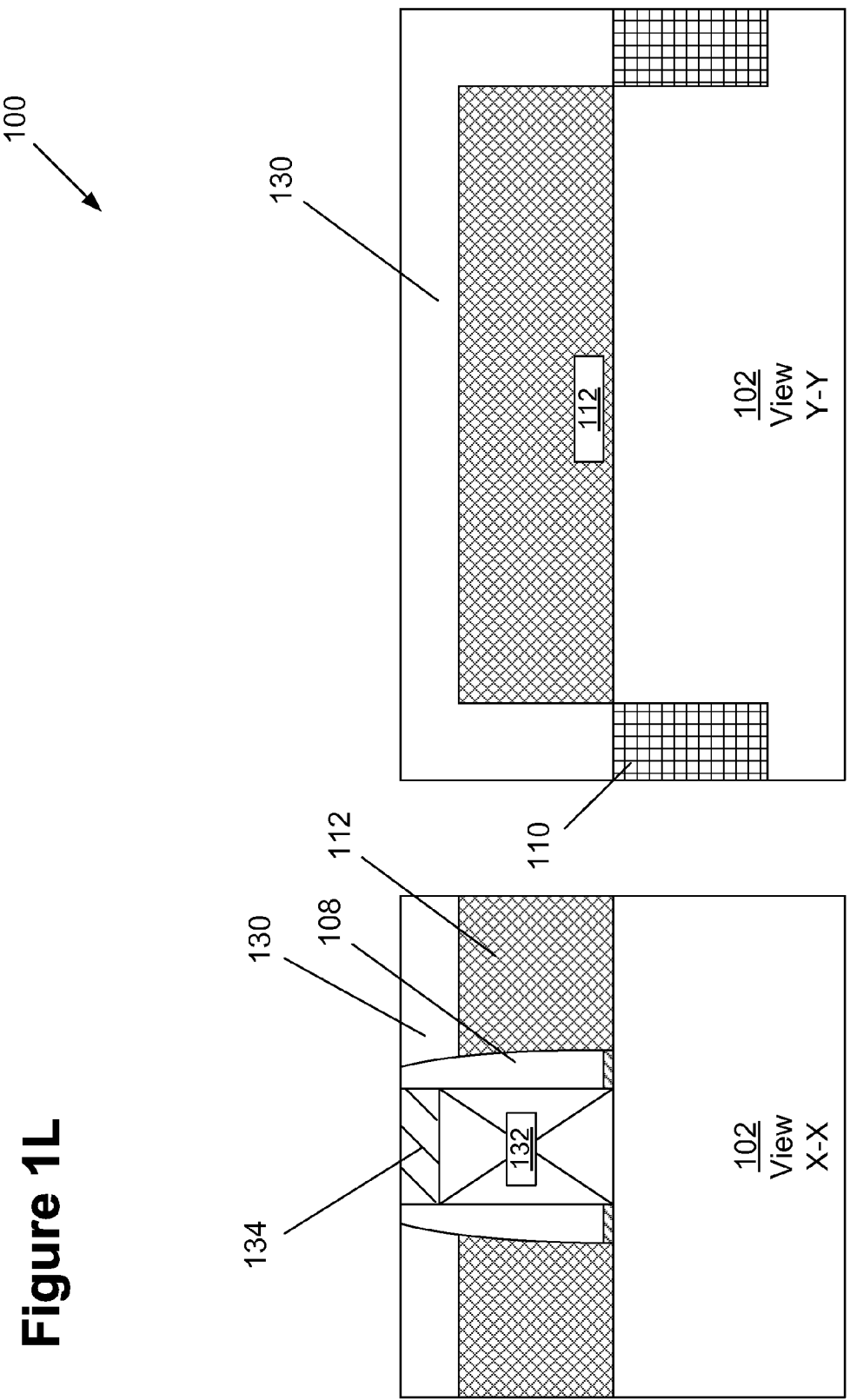

FIGS. 1L-1Q depict another illustrative method of increasing the contact area between a metal silicide material and an epi semiconductor material, and the resulting semiconductor devices. In this embodiment, the device 100 is formed using a replacement gate process. Thus, the gate structure 104 depicted in FIG. 1A is a sacrificial gate structure. FIG. 1L depicts the device 100 at a point of fabrication wherein the epi semiconductor material 112 has been formed on the source/drain regions of the device 100, after a layer of insulating material 130 was formed, and after the gate cap layer 106 (see FIG. 1A) was removed by performing a chemical mechanical polishing (CMP) process relative to a layer of insulating material 130 so as to expose the dummy gate structure 104 for further processing. Thereafter, one or more etching processes were performed to remove the dummy gate structure 104 which resulted in the formation of a gate cavity (not shown) that is laterally defined by the spacers 108 where the final gate structure 132 for the device 100 is to be formed. For example, after the dummy gate structure was removed, a conformal chemical vapor deposition (CVD) or atomic layer deposition (ALD) process may be performed to conformably deposit a gate insulation layer comprised of a high-k layer of insulating material, e.g., hafnium oxide, in the gate cavity. Thereafter, one or more metal or metal alloy layers and/or polysilicon layers (that will become the gate electrode) may be deposited in the gate cavity above the gate insulation layer. A CMP process is then performed to remove excess portions of the deposited layers of material positioned outside the gate cavity. The materials within the gate cavity may then be recessed by performing one or more recess etching processes to make room for a gate cap layer 134 to be formed in the gate cavity above the recessed gate materials. The gate cap layer 134 may be formed by depositing a layer of gate cap material and thereafter performing a CMP process using the layer of insulating material 130 as a polish-stop layer. As before, the gate structure 132 is intended to be representative of any type of gate structure that may be formed using replacement gate techniques. Of course, the materials of construction for the gate structure 132 may be different for a P-type or N-type device.

Figure 1M:
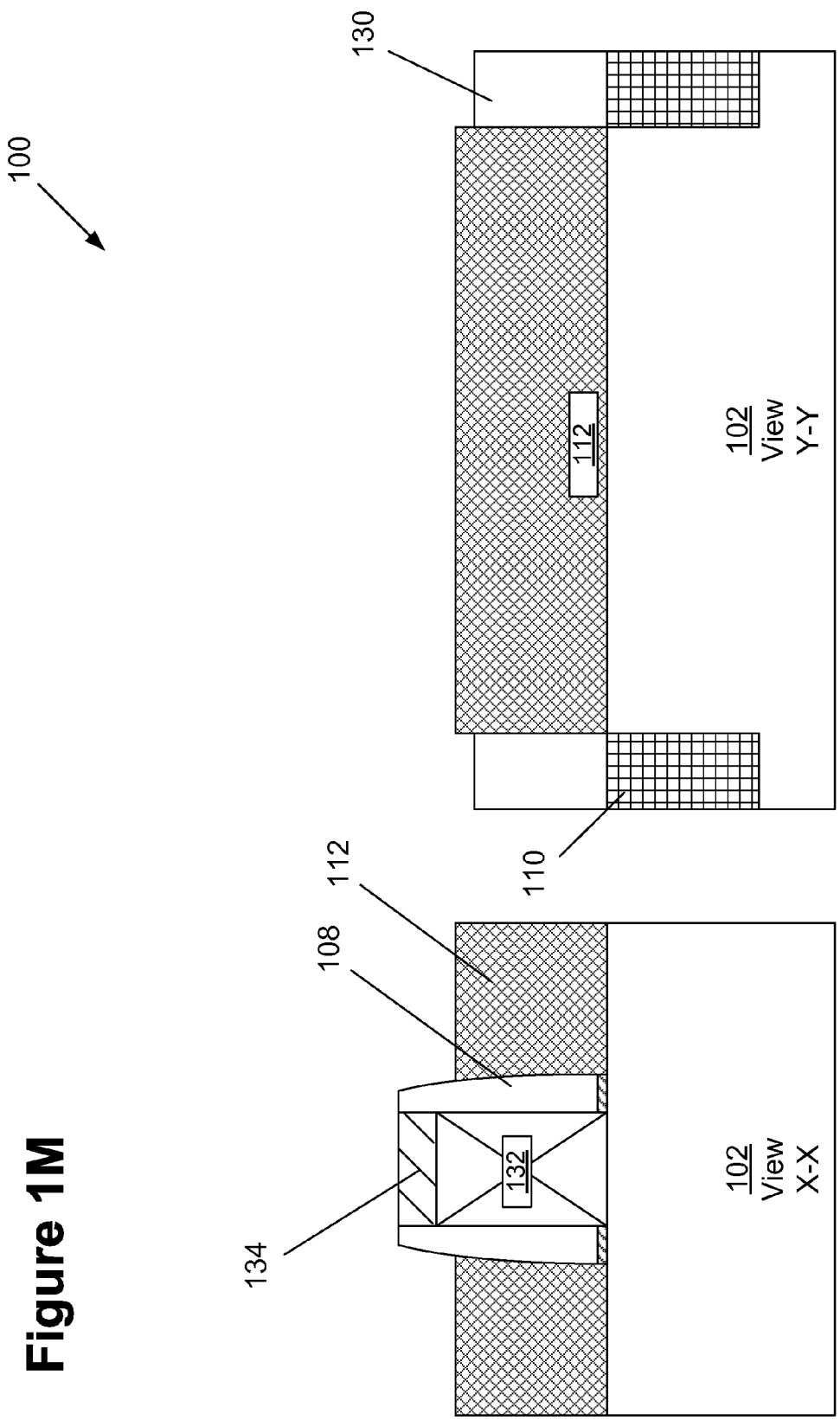

FIG. 1M depicts the device 100 after a timed wet etching process was performed to remove portions of the layer of insulating material 130. This process operation exposes the upper surface of the epi semiconductor material 112.

Figure 1N:
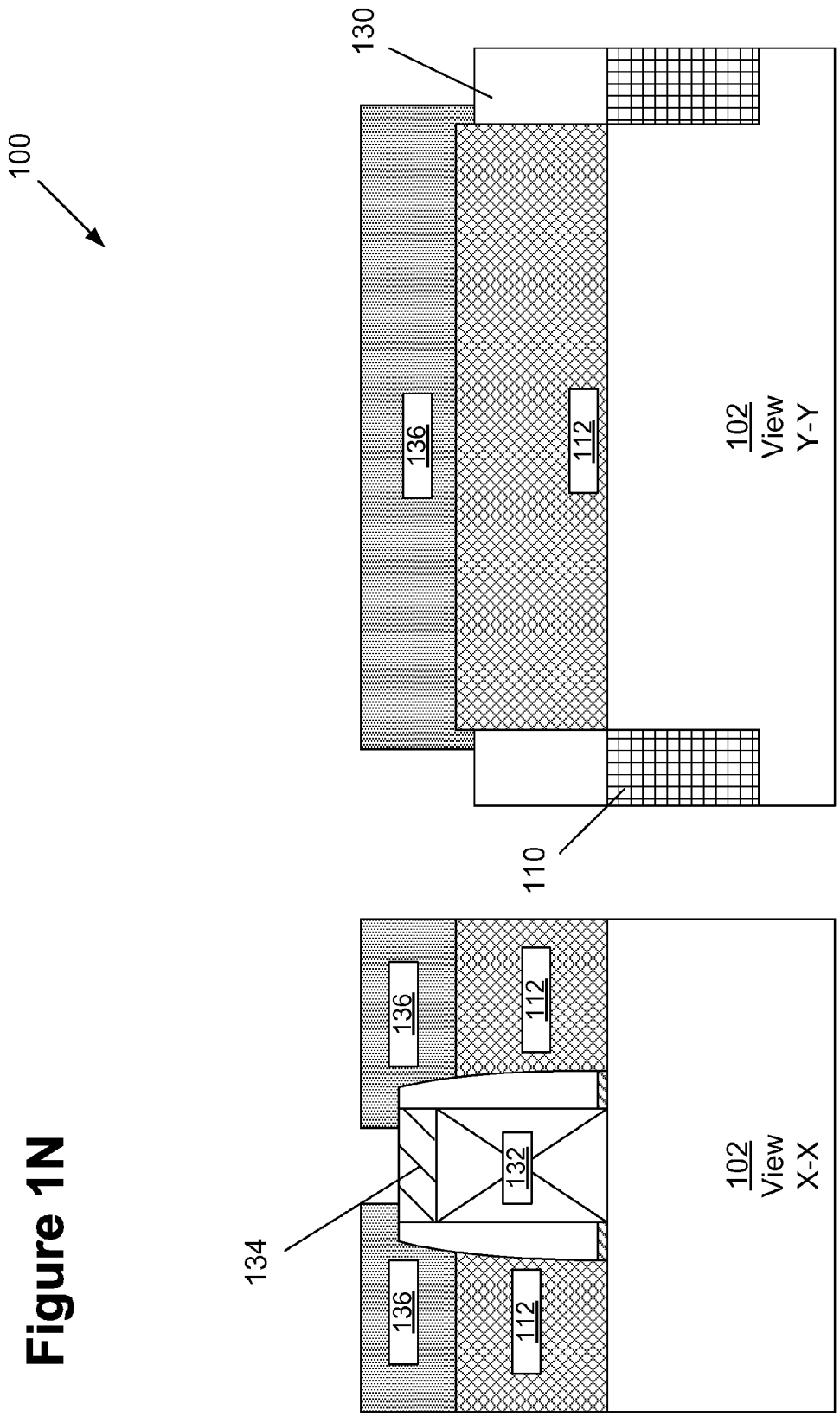
Figure 10:
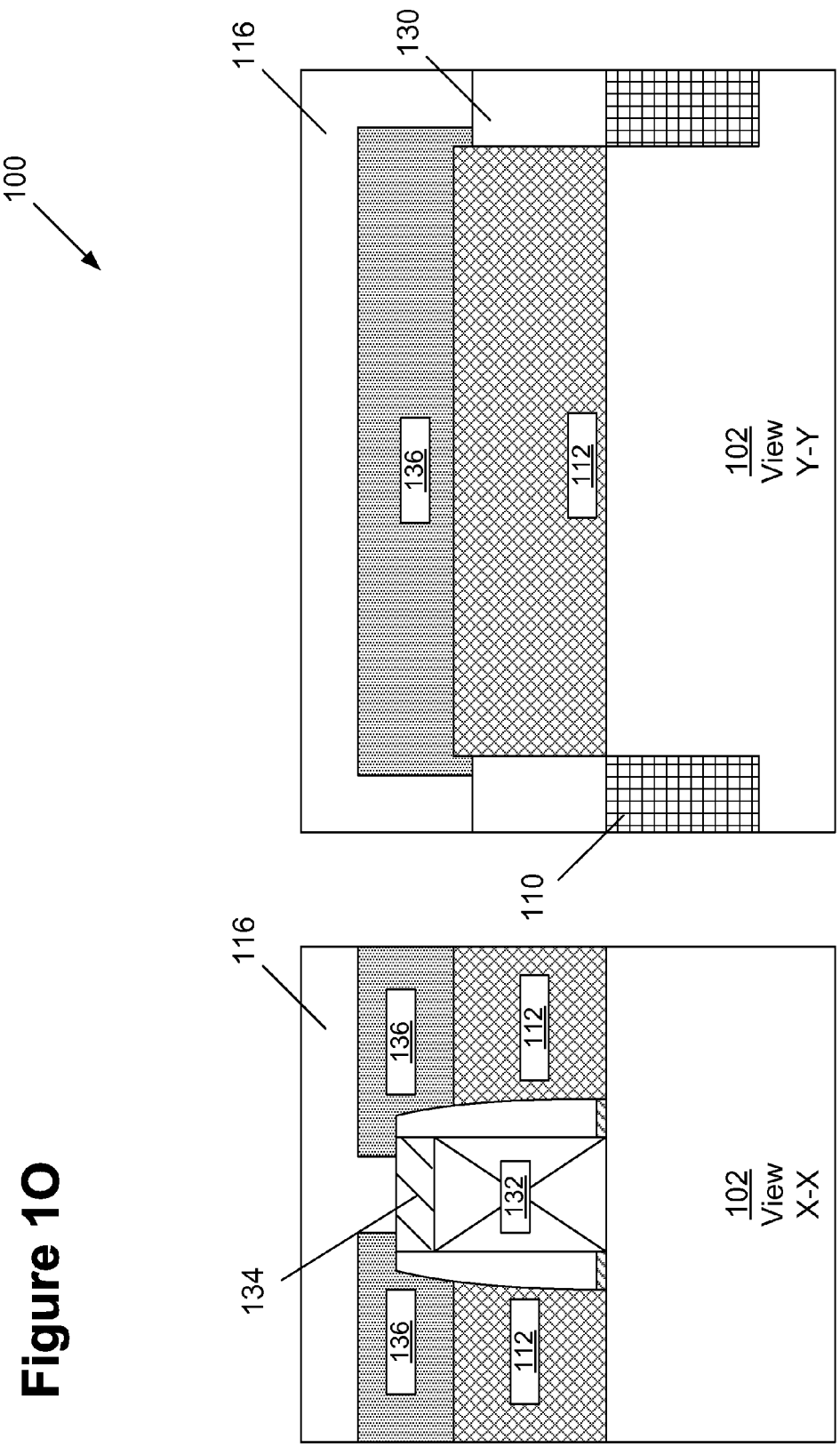

FIG. 1N depicts the product 100 after another epitaxial deposition process was performed to form a second epi semiconductor material 136, e.g., silicon, silicon-germanium, silicon-carbon, etc., on the epi semiconductor material 112 in the source/drain regions of the device 100. Note that some of the epi semiconductor material 136 may grow laterally above the gate cap layer 134 and above the remaining portion of the layer of insulating material 130. The second epi semiconductor material 136 may be formed to any desired thickness, and it may be formed in an unstressed condition or with a desired stress condition (tensile or compressive) in an effort to impart a desired stress on the channel region of the device 100. The second epi material 136 can be doped in-situ, or it can be deposited in an undoped condition and thereafter doped by way of ion implantation. In one illustrative embodiment, the second epi semiconductor material 136 may be comprised of the same material as that of the epi semiconductor material 112, or it may be made of a different material. Different shading is used for the second epi semiconductor material 136 so as to indicate the separate formation of the second epi semiconductor material 136.

At this point in fabrication depicted in FIG. 1N, the process flow depicted in FIGS. 1C-1G is performed to form recesses or trenches in the epi semiconductor materials 136, 112. Accordingly, FIG. 1O depicts the device 100 after the above-described layer of insulating material 116 was formed above the device.

FIG. 1P depicts the device after several process operations were performed. First, one or more etching processes were performed to define the epi recesses or trenches 136A, 112A (collectively the combination of 136A and 112A can be considered to be a single recess) were formed in the epi semiconductor materials 136, 112, respectively. The epi recesses 136A, 112A were formed by performing one or more etching processes through a patterned masking layer (not shown in FIG. 1P). See FIG. 1D. As depicted, the recess extends through the second epi material 136 and into a portion of the epi semiconductor material 112. The epi recesses 136A, 112A may have any desired configuration, and the number of such recesses that are formed may vary depending upon the application. Next, the above-described layer of insulating material 120 was formed so as to over-fill the epi recesses 136A, 112A. See FIG. 1F. Next, the above-described contact openings 122 were formed. See FIG. 1G. These operations result in the structure depicted in FIG. 1P, wherein the epi semiconductor materials 136, 112 are exposed.

FIG. 1Q depicts the device 100 after the above-described metal silicide layer 124 was formed on the epi semiconductor materials 136, 112 and in the epi recesses 136A, 112A. Thereafter, the above-described conductive structures 126 (not shown in FIG. 1Q) are formed in the contact openings 122.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor, said transistor having a gate structure and a source/drain region, the method comprising:

forming said gate structure above an active region of a semiconductor substrate;

performing an epitaxial deposition process to form an epi semiconductor material on said active region in said source/drain region of said transistor, said epi semiconductor material having an upper surface;

performing an etching process on said epi semiconductor material to remove a portion of said epi semiconductor material so as to define at least one epi recess in said epi semiconductor material, wherein said at least one epi recess abuts a sidewall spacer positioned adjacent said gate structure and exposes an outer surface portion of said sidewall spacer;

after defining said at least one epi recess, exposing at least a portion of said upper surface of said epi semiconductor material adjacent said at least one epi recess;

forming a metal silicide layer on said at least said exposed upper surface portion of said epi semiconductor material and in said at least one epi recess; and forming a conductive structure that is conductively coupled to said metal silicide layer.

2. The method of claim 1, wherein said epi semiconductor material is comprised of silicon, silicon-germanium or silicon-carbon.

3. The method of claim 1, wherein said at least one epi recess is a trench.

4. The method of claim 3, wherein said trench has a long axis that is oriented in a direction that is substantially parallel to a gate length direction of said transistor.

5. The method of claim 4, wherein said conductive structure is a line-type feature that is oriented in a direction that is substantially parallel to a gate width direction of said transistor.

6. The method of claim 1, wherein said at least one epi recess has a substantially rectangular cross-sectional configuration when viewed in a cross-section taken in a direction that is substantially parallel to a gate width direction of said transistor.

7. The method of claim 1, wherein an entire bottom surface of said conductive structure contacts an entire upper surface of said metal silicide layer.

8. A method of forming a transistor, said transistor having a gate structure and a source/drain region, the method comprising:

forming said gate structure above an active region of a semiconductor substrate;

performing an epitaxial deposition process to form an epi semiconductor material on said active region in said source/drain region of said transistor, said epi semiconductor material having an upper surface;

performing an etching process on said epi semiconductor material to remove a portion of said epi semiconductor material so as to define at least one epi recess in said epi semiconductor material, wherein said at least one epi recess is a trench that abuts a sidewall spacer positioned adjacent said gate structure and has a long axis that is oriented in a direction that is substantially parallel to a gate length direction of said transistor;

completely filling said at least one epi recess with a first layer of insulating material;

after completely filling said at least one epi recess with said first layer of insulating material, forming a metal silicide layer on said upper surface of said epi semiconductor material and in said at least one epi recess defined in said epi semiconductor material; and forming a conductive structure that conductively contacts said metal silicide layer, wherein said conductive structure is a line-type feature that is oriented in a direction that is substantially parallel to a gate width direction of said transistor.

9. The method of claim 8, wherein said epi semiconductor material is comprised of silicon, silicon-germanium or silicon-carbon.

10. The method of claim 8, wherein said at least one epi recess has a substantially rectangular cross-sectional configuration when viewed in a cross-section taken in a direction that is substantially parallel to a gate width direction of said transistor.

11. The method of claim 8, wherein an entire bottom surface of said conductive structure contacts an entire upper surface of said metal silicide layer.

12. The method of claim 8, wherein said at least one epi recess abutting said sidewall spacer exposes an outer surface portion of said sidewall spacer.

13. The method of claim 8, further comprising, after defining said at least one epi recess, exposing at least a portion of said upper surface of said epi semiconductor material adjacent said at least one epi recess, wherein said metal silicide layer is formed on said at least said exposed upper surface portion of said epi semiconductor material.

14. The method of claim 8, wherein defining said at least one epi recess in said epi semiconductor comprises forming a second layer of insulating material above said upper surface of said epi semiconductor material and forming at least one opening extending through said second layer of insulating material to said upper surface of said epi semiconductor material, said etching process for defining said at least one epi recess being performed through said at least one opening, wherein completely filling said at least one epi recess with said first layer of insulating material comprises completely filling said at least one opening prior to forming said metal silicide layer.

15. The method of claim 14, further comprising, prior to forming said metal silicide layer, forming a contact opening through said first and second layers of insulating material, said contact opening exposing an entire inside surface of said at least one epi recess and at least a portion of said upper surface of said epi semiconductor material adjacent said at least one epi recess, wherein said metal silicide layer is formed so as to extend continuously across said entire inside surface of said at least one epi recess and said at least said upper surface portion of said epi semiconductor material adjacent said at least one epi recess, and wherein said conductive structure is formed in said contact opening.

16. The method of claim 15, wherein said contact opening further exposes an outer sidewall surface of said epi semiconductor material, said metal silicide layer being formed so as to further extend continuously from said at least said portion of said upper surface adjacent said at least one epi recess and across said outer sidewall surface.

17. The method of claim 8, wherein said at least one epi recess has one of a substantially V-shaped cross-sectional configuration and a substantially U-shaped cross-sectional configuration when viewed in a cross-section taken in a direction that is substantially parallel to a gate width direction of said transistor.

18. The method of claim 1, wherein said at least one epi recess has one of a substantially V-shaped cross-sectional configuration and a substantially U-shaped cross-sectional configuration when viewed in a cross-section taken in a direction that is substantially parallel to a gate width direction of said transistor.

19. A method of forming a transistor, the method comprising:
   forming a gate structure of said transistor above an active region of a semiconductor substrate;
   performing an epitaxial deposition process to form an epi semiconductor material on said active region in a source/drain region of said transistor, said epi semiconductor material having an upper surface;
   forming a layer of insulating material above said upper surface of said epi semiconductor material;
   forming at least one opening extending through said layer of insulating material to said upper surface of said epi semiconductor material;
   performing an etching process through said at least one opening so as to form at least one epi recess in said epi semiconductor material;
   after forming said at least one epi recess, forming a contact opening through at least said layer of insulating material, said contact opening exposing at least a portion of said upper surface of said epi semiconductor material adjacent said at least one epi recess;
   after forming said contact opening, forming a metal silicide layer on at least said exposed upper surface portion of said epi semiconductor material and inside said at least one epi recess; and
   forming a conductive structure in said contact opening, wherein said conductive structure is conductively coupled to said metal silicide layer.

20. The method of claim 19, further comprising, after forming said at least one epi recess in said epi semiconductor material, forming a second layer of insulating material above said layer of insulating material, said second layer of insulating material filling said at least one epi recess and said at least one opening extending through said layer of insulating material.

21. The method of claim 20, wherein forming said contact opening comprises removing said second layer of insulating material from said at least one epi recess so as to expose all inside surfaces of said at least one epi recess.

22. The method of claim 19, wherein said at least one epi recess is a trench having a long axis that is oriented in a direction that is substantially parallel to a gate length direction of said transistor.

* * * * *